Nov. 7, 1961 J. E. McNAMARA 3,007,819

METHOD OF TREATING SEMICONDUCTOR MATERIAL

Original Filed July 7, 1958 2 Sheets-Sheet 1

INVENTOR.
John E. McNamara,
BY Mueller & Aichele
Att'ys.

Nov. 7, 1961

J. E. McNAMARA 3,007,819

METHOD OF TREATING SEMICONDUCTOR MATERIAL

Original Filed July 7, 1958

2 Sheets-Sheet 2

INVENTOR.
John E. McNamara,
BY Mueller & Aichele
Att'ys

United States Patent Office 3,007,819

Patented Nov. 7, 1961

3,007,819

METHOD OF TREATING SEMICONDUCTOR MATERIAL

John E. McNamara, Phoenix, Ariz., assignor to Motorola, Inc., Chicago, Ill., a corporation of Illinois Continuation of application Ser. No. 746,755, July 7, 1958. This application July 2, 1959, Ser. No. 825,387
13 Claims. (Cl. 148—13)

This invention relates to methods of treating semiconductor materials to partially neutralize and minimize changes in resistivity and lifetime resulting from their exposure to relatively high temperatures such as are employed in a diffusion process. More particularly, the invention relates to methods of treating high resistivity germanium of N-type conductivity or substantially intrinsic conductivity to partially neutralize and minimize such effects.

This application is a continuation of application Serial No. 746,755, filed July 7, 1958, now abandoned.

In the production of certain types of transistors, particularly those adapted to high frequency applications, it is desirable to provide a body of germanium having a high resistivity substrate region of N-type conductivity or substantially intrinsic conductivity, and an adjacent region of graded resistivity. The graded resistivity region is frequently made by the diffusion of donor-type impurities into a germanium die or wafer. This involves the heating of the germanium to an elevated temperature as high as 800° C. or higher. During such treatment, a relatively large number of acceptor type impurities are unintentionally but inevitably introduced into the germanium. One proposed method of neutralizing or minimizing this effect, known as thermal conversion, is by subsequently heating the germanium in contact with potassium cyanide to chemically leach the acceptor type impurities. However, this treatment, of itself, is only partially effective so that in commercial practice a residue of introduced acceptors remains in the germanium and is often large enough to convert high resistivity N-type germanium or nearly intrinsic germanium to P-type material. As a result, quantities of processed germanium wafers are rendered useless for the application intended. This phenomenon has heretofore seriously impeded the application of high resistivity germanium to the manufacture of high frequency diffused-base transistors on a commercially successful basis.

Another undesirable side effect incident to the treatment of N-type germanium at high temperatures is that of lifetime degradation of minority carriers. Since most of the current carried across the base of the transistor is by means of minority carriers, it is desirable for efficient transistor operation that the lifetime of these carriers be sufficient to permit them to pass from the emitter to the collector.

It is an object of this invention to provide a reliable and commercially practical method of forming diffused base transistors with N-type graded resistivity layers and N-type or intrinsic substrates of controlled resistivity.

It is another object of the invention to provide a method for at least partially neutralizing the changes in acceptor concentration caused by the exposure of germanium to elevated temperatures.

Another object is to provide a method of treating high resistivity N-type germanium bodies to diffuse a donor-type impurity into the body and subsequently neutralizing the thermal conversion effects incident to the exposure of the germanium to a high temperature during the diffusion step.

Still a further object of the invention is to minimize the lifetime degradation of minority carriers in N-type germanium caused by exposure of the germanium to relatively high temperatures.

A feature of the invention is the provision of a controlled cooling step both after exposure of germanium to temperatures at which thermal conversion occurs and the subsequent potassium cyanide leaching treatment. The cooling step appears to enhance the effectiveness of the cyanide treatment in reducing residual acceptor content of the germanium.

Another feature of the invention is the employment of a controlled cooling step subsequent to treatment of germanium with molten potassium cyanide in order to partially neutralize the effect of prior thermal conversion on such germanium.

Still another feature of the invention is the provision of extended annealing treatment at about 475° C. for germanium wafers that have been treated in contact with molten potassium cyanide. When used in conjunction with the controlled cooling steps previously mentioned, such annealing assists in the reduction in the concentration of residual acceptors in germanium and at least partially neutralizes the adverse effects of heat treatment on minority carrier lifetime.

In accordance with this invention, the effects of thermal conversion on germanium are at least partially neutralized by a method including the slow, controlled cooling of a germanium body which has been exposed to temperatures sufficiently high to effect thermal conversion. The germanium body is subsequently coated with potassium cyanide and heat treated or leached for a predetermined length of time at a temperature wherein the cyanide is molten. The germanium is cooled slowly at a controlled rate from the treating temperature to about 475° C. and is then annealed at that temperature. Although the cooling, leaching and annealing steps by themselves have been found relatively ineffective in neutralizing the effects of thermal conversion in the treatment of high resistivity material, the use of these steps in combination has been found to reduce the number of residual acceptors to a commercially practical extent. The invention thus permits nearly intrinsic or high resistivity N-type germanium to be used in processes involving heat treating at temperatures of about 800° C. without producing an undesired irreversible change in conductivity type. The invention may, of course, be used for the reduction of thermally introduced acceptors from germanium of any resistivity value or conductivity type.

Figure 5:
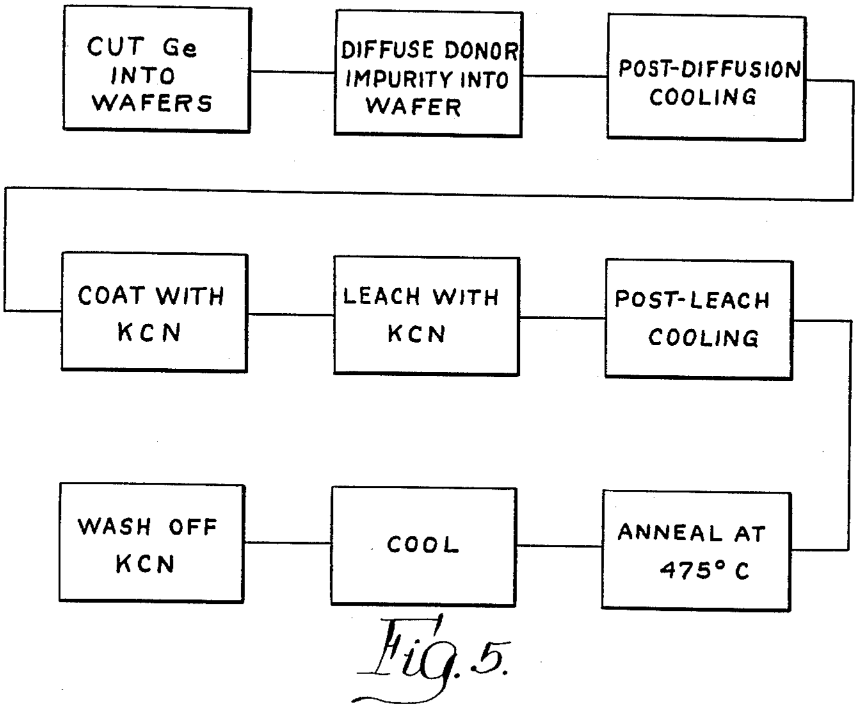
FIG. 5 is flow diagram showing the various steps of the process of the invention.

FIG. 5 of the accompanying drawings is a flow chart indicating the various steps included in the method of the present invention. Preparatory to treatment in accordance with the invention, N-type germanium of high resistivity is sawed or otherwise cut or formed into wafers from a larger germanium crystal. High resistivity germanium has a specific resistivity of at least about 15 ohm-centimeters measured at 27° C. The term "high resistivity germanium" is thus intended to include both high resistivity extrinsic germanium and substantially intrinsic germanium. Typically, the germanium is cut into wafers of about ¼ inch in diameter and from 15 to 50 mils thick depending upon the particular application in which they are to be used.

Figure 1:
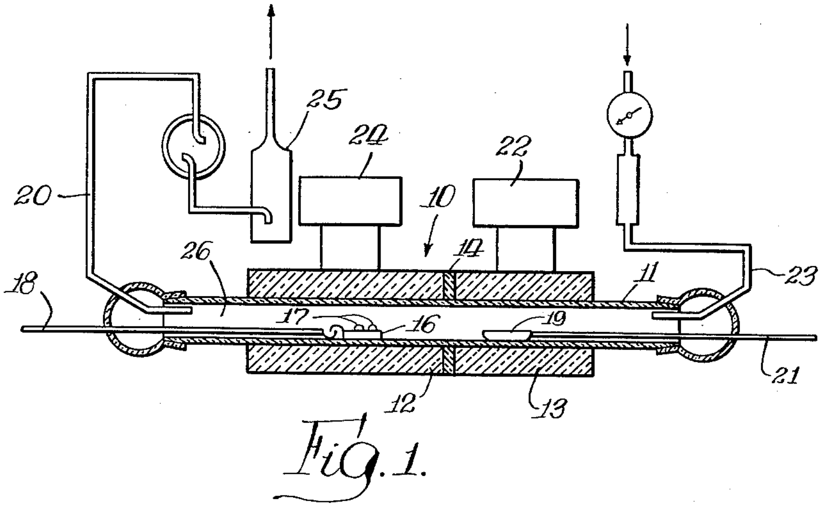
FIG. 1 is a diagrammatic view in section of a furnace used in the diffusion of impurities into germanium.

Diffusion of a donor-type impurity into the germanium is accomplished in the furnace 10 (FIG. 1) which includes a horizontal quartz tube 11 and a pair of separate furnace sections 12 and 13 having suitable electrical heating elements in their walls. The sections are separated by a suitable insulating spacer 14 so that they may be maintained at different temperatures. The diffusion section 12 contains a quartz boat 16 in which germanium wafers 17 are placed. Pushrod 18 connected to the boat is used to position it at the desired place within the furnace. A small amount of powdered antimony or other antimony source is introduced into the vaporizing section 13 of the furnace in the container 19 at the end of pushrod 21. The temperature in the vaporizing section is maintained at about 320° C. by means of the temperature control means 22 in order to vaporize the antimony. A suitable carrier gas, preferably hydrogen, is introduced into the furnace at one end thereof through the line 23 and flows over the antimony container 19 picking up antimony vapor and transferring it to the diffusion section 12.

The part of the diffusion section 12 in which boat 16 is located is maintained at a higher temperature between 650° and 940° C. (preferably near 800° C.) by means of the temperature control unit 24. The antimony vapor deposits on the germanium wafer 17 and diffuses therein in accordance with the principles well known to those skilled in the art. The wafers are maintained at the diffusion temperature in contact with the antimony vapor for varying periods depending on the depth of diffusion desired and the temperature within the diffusion section. For example, at a temperature of 800° C. a diffusion period of 4½ hours has been found suitable for many purposes. The carrier gas leaves the furnace through the conduit 20 and is exhausted through the bubbler 25.

During the period in which the germanium wafers 17 are exposed to a high temperature, the process of thermal conversion takes place. The result of thermal conversion is a net increase in the number of acceptor-type impurities and hence the number of holes in the germanium. It is believed that the principal source of thermal conversion is copper which diffuses quite rapidly in comparison to antimony. The thermal conversion takes place despite the most scrupulous efforts to exclude small quantities of copper from the surfaces of the diffusion system or the germanium. Crystal dislocations and quenched-in impurities are also believed to contribute to thermal conversion. It has been found that thermal conversion takes place to some extent at temperatures above 500° C. and is substantially increased at temperatures above 600° C. Exposure of germanium to a temperature of 800° C. for a period of one hour results in resistivity changes indicating the addition of from $3 \times 10^{14}$ to $4 \times 10^{15}$ holes or acceptors per cubic centimeter. The addition of this large a concentration of holes or acceptors is sufficient to change high resistivity N-type or intrinsic germanium to P-type material and thus form a rectifying PN junction between the diffused layer of donor-rich N-type material and the thermally converted substrate. This renders the resultant germanium wafer unfit for use in high frequency transistor applications.

Figure 6:
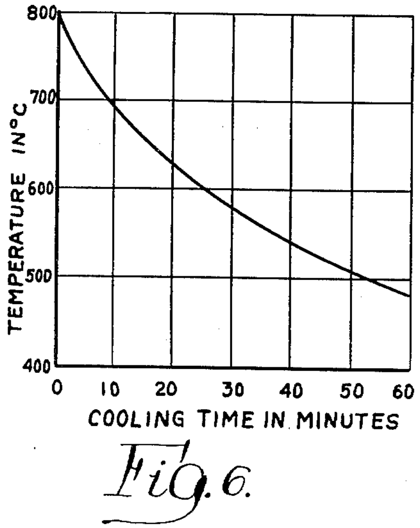
FIG. 6 is a graph of temperature against cooling time employed in post-diffusion cooling of germanium in accordance with one embodiment of the invention.

In accordance with this invention, it has been found desirable after diffusion to cool the germanium wafers 17 very slowly from 800° C. to about 475° C. Below the latter temperature, the cooling rate has no undesirable effect on the bulk properties of germanium. By slow cooling as used hereinafter in the specification and the appended claims, it is meant that the temperature is lowered at such a rate that the temperature of the wafers falls from 800° C. to 475° C. in not less than about 1 hour. One convenient way of accomplishing this cooling is to use a furnace which cools sufficiently slowly so that the temperature of the wafers will drop to 475° C. from 800° C. in not less than an hour when the power for the electric heating elements is turned off. As will subsequently be illustrated, it has been found that the post diffusion cooling step is quite important in the overall process of neutralizing the thermal conversion which takes place during the high temperature treatment of germanium. For example, if the wafers are quenched by pulling them rapidly toward the end of the furnace indicated at 26 which is substantially cooler than the portion in which the wafers are placed during diffusion, the efficiency of the subsequent cyanide leaching process is substantially impaired. FIG. 6 is a graph of cooling time against temperature for a particular furnace which cools at a satisfactory rate after turning off the heating elements. This curve is illustrative of a specific satisfactory post diffusion cooling rate.

Following the post diffusion cooling step, the germanium wafers 17 are removed from the furnace and coated with a thin layer of potassium cyanide. The wafers are then heated to a temperature at which the cyanide becomes molten and held at that temptrature in order to extract or leach acceptor type impurities such as copper from the germanium.

Figure 2:
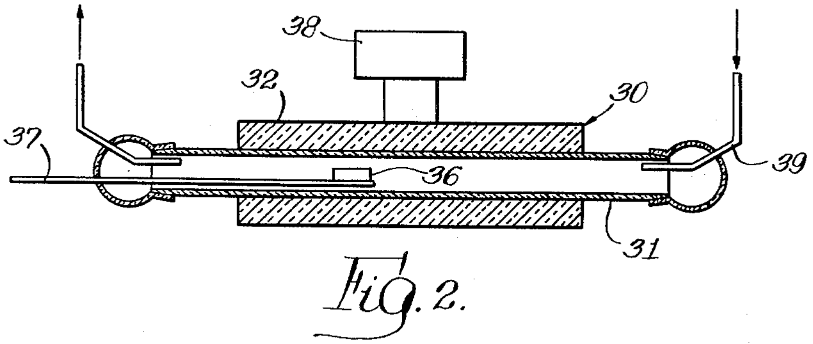
FIG. 2 is a diagrammatic view in section of a furnace used is the heat treatment of diffused semiconductor wafers while in contact with potassium cyanide.
Figure 4:
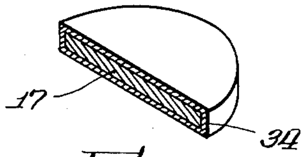
FIG. 4 is a perspective view of a cut-away portion of a germanium wafer coated with potassium cyanide.

The leaching operation is carried out in a horizontal furnace illustrated generally in FIG. 2 at 30. The furnace 30 consists of a horizontal Alundum tube 31 surrounded by a furnace body 32 containing suitable electric heating elements connected to the temperature control unit 38. The coated wafers 33 (see FIG. 4) may have the cyanide layer applied in any convenient manner such as dipping them in a saturated alcohol suspension, or by sprinkling a layer of cyanide over the wafers. FIG. 4 shows the germanium wafer 17 surrounded by a uniform coating 34 of cyanide. Another convenient method of coating is by applying the cyanide suspension during the stacking of the wafers into the germanium boat or container 36. A thin layer of saturated alcohol-cyanide suspension is placed in the bottom of the boat and a first layer of wafers is placed thereon. Another thin layer of suspension is added to cover the wafers, another layer of wafers is stacked coin-like on top of the first layer and an additional amount of cyanide suspension added to cover all of the wafers. The process is repeated until the boat is filled. The boat is then heated to about 80° C. to evaporate the alcohol and coat the wafers with a layer of 34 of cyanide.

The loaded boat 36 is attached to the end of a push rod 37 which is used to introduce it into the tube 31. There the wafers are heated to melt the cyanide and leach the acceptor impurities from the wafers. The temperature of the wafers is maintained above about 650° C. which is just above the melting point of potassium cyanide and below the melting point of germanium, which latter is 940° C. Preferably, the temperature of the leaching process is maintained between 650° C. and 700° C.

As shown in FIG. 2 a carrier gas is introduced into the tube 31 through the line 39 to provide a controlled ambient atmosphere. Since small amounst of oxygen are almost inevitably present within the furnace 30, it has been found desirable to provide an ambient reducing atmosphere such as hydrogen. The reducing atmosphere reacts with the oxygen and prevents its combination with the germanium of wafer 17 to form germanium oxides. Formation of such oxides produces an irregular surface on the wafers 17 or reduces their thickness. Since uniform and controlled wafer thickness is required to produce transistors of predictable electrical characteristics, it is desirable to avoid such etching.

Figure 3:
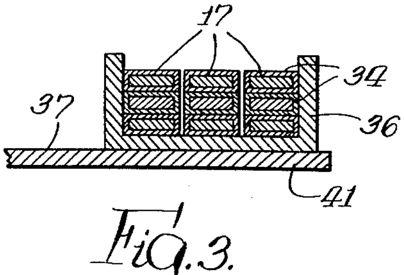
FIG. 3 is a view in section showing coated germanium wafers stacked in a boat and coated with potassium cyanide for a leaching treatment.

As shown in FIG. 3, the wafers are supported in a hollowed out germanium boat 36 supported on a flat quartz slab 41. The use of germanium in the boat 36 has been found to reduce substantially the number of wafers cracking due to temperature change. It is believed that this is because of the matched thermal coefficient of expansion between the wafers and the boat. Aluminum oxide may also be used to form the boat 36 because its coefficient of thermal expansion is quite similar to that of germanium.

Figure 7:
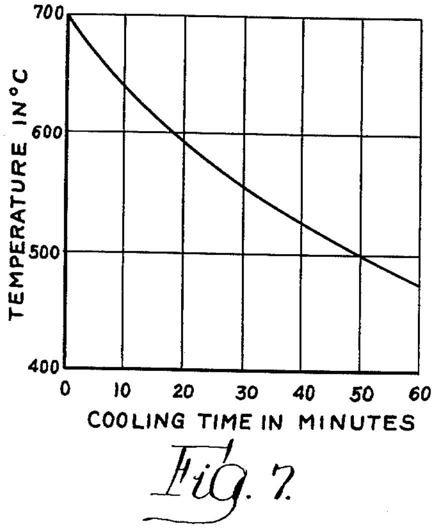
FIG. 7 is a graph of temperature against cooling time employed in post-leaching cooling of germanium in accordance with one embodiment of the invention.

The germanium wafers are maintained in the furnace 30 at a temperature of between 650° C. and 700° C. for a period between 15 and 60 minutes depending upon wafer thickness. Following the leaching step, the wafers are cooled slowly to about 475° C. from the leaching temperature. A particularly effective cooling rate has been found to be that of 5° C. per 5 minutes. However, satisfactory results are also obtained by employing a furnace having a natural cooling rate similar to that of the diffusion furnace and cooling by cutting off power from the heating elements. The cooling rate of such a furnace is illustrated in FIG. 7.

Following post leaching cooling, the wafers are annealed in the hydrogen atmosphere at about 475° C. for an additional period. The post leaching anneal has been found to have a desirable effect in minimizing the reduction of minority carrier lifetime in the N-type germanium. Particularly effective results have been obtained by annealing for 15½ hours, but in many applications a shorter annealing period of about 4½ hours has been found to produce satisfactory material.

Following the annealing period the boat 36 is removed from the furnace, the wafers cooled and the cyanide layers 34 washed away. Since the diffused layer extends over all of the surfaces of the wafers they are lapped to remove one of such layers and are ready for further processing in transistor manufacture.

A specific embodiment of the present invention used in the manufacture of high frequency diffused base transistors includes the steps of diffusion antimony into germanium while the germanium wafers are held at a temperature of 800° C. for a period of 4½ hours, slowly cooling the diffused germanium from 800° C. to 475° C. at the rate shown in FIG. 6, subsequently coating the diffused wafers with potassium cyanide and heating them to a temperature of 650° C. in a hydrogen atmosphere for a period of 15 minutes. Subsequently the coated wafers are cooled from 650° C. to 475° C. at the rate illustrated by FIG. 7, and they are then annealed in hydrogen at 475° C. for a period of 4½ hours.

Tables I and II below illustrate the unexpected effect of the post diffusion cooling rate on the number of acceptors added to the germanium by heat treatment and on the lifetime of minority carriers in the germanium. Resistivity of the germanium in the undiffused substrate was measured before and after treatment to determine the net increase in acceptor atoms. Treatment at 800° C. normally introduces between $3\times10^{14}$ and $4\times10^{15}$ holes or acceptors per cubic centimeter into germanium. Thus, the figure $\Delta N_A$ indicates the net change in acceptors or holes of a sample that has been subjected to thermal conversion and then treated to partly neutralize this effect. A small value for $\Delta N_A$ indicates more effective neutralization of thermal conversion. The term "furnace cooling" as used in the appended tables indicates slow cooling by cutting off furnace power, and it was at the rate shown in FIG. 6 for post diffusion cooling, and at the rate shown in FIG. 7 for post leaching cooling.

Table I indicates that rapid cooling or quenching after diffusion as by pulling the germanium wafers from the hot to the cold end of the furnace results in the production of material having rather short minority carrier lifetime. Table II shows that slow cooling after diffusion results in a smaller reduction of minority carrier lifetime as well as reducing substantially the net number of acceptors introduced by thermal conversion. Table II also indicates that slow cooling after leaching is preferable to rapid cooling after leaching even when such rapid cooling is in conjunction with slow post diffusion cooling. Thus, both cooling steps i.e., after diffusion and after leaching should be slow in order to produce the greatest amount of neutralization of thermal conversion and to produce material having satisfactory minority carrier lifetimes.

TABLE I

*Samples were quenched after 800° C. heat treatment*

| Cooling Rate After 30 Min. Leach at 700° C. | $\Delta N_A$ atoms/cc. | Initial Lifetime, μsec. | Final Lifetime, μsec. |
|---|---|---|---|
| Furnace Cooled to 475° C. with 6 Hour Anneal | $4.2\times10^{13}$ | 250 | 4 |
| Furnace Cooled to 475° C. with 9 Hour Anneal | $4.1\times10^{13}$ | 360 | 3 |
| Furnace Cooled to 475° C. with 12 Hour Anneal | $3.5\times10^{13}$ | 296 | 4 |
| Furnace Cooled to 475° C. with 15½ Hour Anneal | $2.6\times10^{13}$ | 381 | 14 |
| 5°/5 Min. to 475° with 15½ Hour Anneal | $2.7\times10^{13}$ | 326 | 17 |

TABLE II

*Samples were furnace cooled after 800° C. heat treatment*

| Cooling Rate After 30 Min. Leach at 700° C. | $\Delta N_A$ atoms/cc. | Initial Lifetime, μsec. | Final Lifetime, μsec. |
|---|---|---|---|
| Quenched to Room Temperature | $3.3\times10^{13}$ | 228 | 10 |
| Quenched to 475° C. with 15½ Hour Anneal | $3.2\times10^{13}$ | 358 | 5 |
| 5°/5 Min. to 475° with 6 Hour Anneal | $2.5\times10^{13}$ | 345 | 57 |
| 5°/5 Min. to 475° with 9 Hour Anneal | $1.8\times10^{13}$ | 325 | 40 |
| 5°/5 Min. to 475° with 12 Hour Anneal | $2.2\times10^{13}$ | 248 | 42 |
| 5°/5 Min. to 475° with 15½ Hour Anneal | $2.1\times10^{13}$ | 377 | 51 |

Table III below is a comparison of the use of furnace cooling rate after leaching with a slower rate at 5° per 5 minutes. Both these methods produce germanium samples satisfactory for use in diffused base transistors which had not been converted from N-type to P-type material.

TABLE III

*Samples were furnace cooled after 800° C. heat treatment*

| Cooling Rate After 30 Min. Leach at 650° C. | $\Delta N_A$ atoms/cc. | Initial Lifetime, μsec. | Final Lifetime, μsec. |
|---|---|---|---|
| Furnace Cooled to 475° C. with 15½ Hour Anneal | $2.2\times10^{13}$ | 431 | 100 |
| 5°/5 Min. to 475° C. with 15½ Hour Anneal | $0.6\times10^{13}$ | 328 | 138 |

The present invention therefore, provides a practical method of partly neutralizing to a controlled extent the effects of thermal conversion in introducing acceptors into germanium. One of the advantages of the process is that it permits the use of relatively high resistivity germanium as a starting material into which donor impurities are diffused while minimizing the danger of conversion to P-type material due to thermal conversion. The process of the invention may also be used in the treatment of P-type germanium where it is desired to expose this material to relatively high temperature without introducing additional acceptors which would have the effect of lowering the resistivity of such material. The combination of cooling, of leaching, and of annealing steps produces a unique reduction in the net amount of acceptors introduced, which result is not obtained from the use of any of these steps used singly.

I claim:

1. A method of treating a germanium body after diffusion of desired donor impurities into said body at an elevated temperature to at least partially neutralize the effect of such temperatures on the net concentration of acceptor impurities within said body, said method including the steps of cooling the germanium body from the aforesaid elevated temperature at a controlled rate to a temperature in the vicinity of 475° C. below which the cooling rate has no substantial effect on the bulk properties of said germanium body, subsequently melting potassium cyanide in contact with said germanium body to leach undesired fast-diffusing acceptor impurities out of said body, subsequently cooling said germanium body and molten potassium cyanide together at a controlled rate to a temperature in the vicinity of 475° C. below which the cooling rate has no substantial effect on the bulk properties of said germanium body, and subsequently annealing said germanium body for a predetermined time.

2. A method of treating a diffused germanium body to at least partially neutralize the effects of exposure of said germanium body to an elevated temperature on the net acceptor concentration within said body, said method including the steps of cooling said germanium body from the aforesaid elevated temperature at a controlled rate to a temperature of about 475° C., subsequently melting potassium cyanide in contact with said germanium body to leach out fast diffusing acceptor impurities, subsequently cooling said germanium body and potassium cyanide together at a controlled rate to a temperature of about 475° C. and subsequently annealing said germanium body at a temperature of about 475° C.

3. A method of producing a germanium body having a surface layer of N-type conductivity the resistivity of which increases toward the interior of the body and having a region of high resistivity blending with said surface layer in the interior of said body, said method including the steps of contacting a body of high resistivity germanium with a donor-type diffusant while maintaining said germanium body at a temperature effective to cause diffusion of said diffusant into a portion of said body and to increase the acceptor impurity concentration in another portion of said body, subsequently contacting said germanium body with potassium cyanide at a temperature above the melting point of potassium cyanide and below the melting point of germanium, subsequently cooling said germanium body and potassium cyanide at a controlled rate to a temperature of about 475° C., and subsequently annealing said germanium body at a temperature of about 475° C.

4. A method of producing a germanium body having a surface layer of N-type conductivity, the resistivity of which increases toward the interior of said body and having a region of high resistivity blending with said surface layer in the interior of said body, said method including the steps of contacting a body of high resistivity germanium with a donor-type diffusant while maintaining said germanium body at a temperature between about 650° C. and about 800° C., cooling said germanium body to a temperature of about 475° C., at a controlled rate, subsequently heating said germanium body in a reducing atmosphere to a temperature of between 650° C. and 940° C. while in contact with potassium cyanide, subsequently cooling said germanium body at a controlled rate to a temperature of about 475° C. and subsequently annealing said germanium body at about 475° C.

5. A method of producing a germanium body having a surface layer of N-type conductivity the resistivity of which increases toward the interior of said body and having a region of high resistivity germanium blending with said surface layer in the interior of said body, said method including the steps of contacting a body of high resistivity germanium with a donor-type diffusant while maintaining said germanium body at a temperature between about 650° C. and about 940° C., slowly cooling said germanium body, subsequently heating said germanium body in a hydrogen atmosphere to a temperature in the range of about 650° C. to about 940° C. while in contact with potassium cyanide, subsequently cooling said germanium body to a temperature of about 475° C., and subsequently annealing said germanium body at a temperature of about 475° C.

6. A method of producing a germanium body having a surface layer of N-type conductivity the resistivity of which increases toward the interior of the body and having a region of high resistivity germanium blending with said surface layer in the interior of said body, said method including the steps of contacting a body of high resistivity germanium with a donor-type diffusant while maintaining said germanium body at a temperature of about 800° C., cooling said germanium body to about 475° C. over a period of at least about one hour, subsequently heating said germanium body to a temperature between about 650° C. and about 700° C. in a hydrogen atmosphere while said body is in contact with potassium cyanide, subsequently cooling said germanium body to a temperature of about 475° C., and subsequently annealing said germanium body at a temperature of about 475° C. while said body is in contact with potassium cyanide.

7. The method of neutralizing thermal conversion in germanium originally of N-type conductivity that has been heat treated at an elevated temperature sufficient to effect thermal conversion, said method including the steps of slowly cooling a body of germanium from said elevated temperature to a temperature below that at which thermal conversion occurs, subsequently heating said germanium body to a temperature between about 650° C. and 700° C. in a reducing atmosphere while in contact with potassium cyanide, subsequently slowly cooling said germanium body to a temperature of about 475° C., and subsequently annealing said germanium body at a temperature of about 475° C.

8. The method according to claim 7 wherein said reducing atmosphere is hydrogen.

9. A method of producing a germanium body having a surface layer of N-type conductivity, the resistivity of which increases toward the interior of said body and having a region of high resistivity germanium blending with said surface layer in the interior of said body, said method including in combination the steps of contacting a body of high resistivity germanium with antimony vapor while maintaining said germanium body at a temperature of about 800° C., cooling said germanium body from about 800° C. to about 475° C. over a period of not less than about one hour, subsequently heating said germanium body in a hydrogen atmosphere to a temperature of about 700° C. while in contact with potassium cyanide, maintaining said germanium body at about 700° C. and in contact with potassium cyanide for a predetermined period, subsequently cooling said germanium body slowly to a temperature of about 475° C., and annealing said germanium body at a temperature of about 475° C. for at least about 4½ hours.

10. A method of treating a germanium body to at least partially neutralize the effects of exposure of said germanium body to an elevated temperature on the net acceptor concentration and minority carrier lifetime within said body, said method including in combination, the steps of slowly cooling said germanium body to a temperature of about 475° C. from the aforesaid elevated temperature, subsequently coating said germanium body with potassium cyanide, heating the coated body in a hydrogen atmosphere to a temperature between about 650° C. and about 700° C., maintaining said germanium body in the aforesaid temperature range for a predetermined period, subsequently cooling the coated germanium body to a temperature of about 475° C. at a rate of about 5° C. per five minutes, and subsequently annealing said body in a hydrogen atmosphere at about 475° C. for at least about 4½ hours.

11. The method of reducing the concentration of undesired acceptor impurities in fragile germanium wafers of a thickness suitable for use in the manufacture of transistors while minimizing breakage of said wafers, including in combination the steps of providing a germanium holder for said wafers, disposing potassium cyanide-coated wafers in a stacked condition on said holder, heating said coated wafers to a temperature in the range of 650° C. to 700° C., subsequently cooling said wafers stacked on said holder to a temperature of about 475° C., and subsequently annealing said wafers at about 475° C.

12. In a process for fabricating a doped germanium body in which the body is heated to an elevated temperature between 650° C. and 940° C. such that degradation of the minority carrier lifetime value of the material of the body normally occurs upon cooling the body, a method for limiting such minority carrier lifetime degradation which comprises, cooling said body from the aforesaid elevated temperature at a controlled rate at least as slow as about 5° C. per five minutes through a temperature range of at least 175° C. until the body reaches a selected temperature less than 650° C. below which the cooling rate has no substantial effect on the bulk properties of the doped germanium material.

13. A method of controlling the minority carrier lifetime value of semiconductive germanium material which has been heated at an elevated temperature in the range from about 650° C. to about 940° C., which method comprises cooling said semiconductive germanium material from an elevated temperature within said range at a controlled rate at least as slow as about 5° C. per five minutes, and continuing such cooling at said controlled rate at least until said germanium material reaches a selected temperature of about 475° C. below which selected temperature the cooling rate has no substantial adverse effect on the bulk properties of the germanium material.

References Cited in the file of this patent

UNITED STATES PATENTS

| | | |
|---|---|---|
| 2,639,246 | Dunlap | May 19, 1953 |
| 2,788,300 | Dawson | Apr. 9, 1957 |